United States Patent [19]

Ul Haq

[11] Patent Number: 5,126,970
[45] Date of Patent: Jun. 30, 1992

[54] STATIC RANDOM ACCESS MEMORY WITH PMOS PASS GATES

[75] Inventor: Ejaz Ul Haq, Sunnyvale, Calif.

[73] Assignee: VLSI Technology, Inc., San Jose, Calif.

[21] Appl. No.: 505,730

[22] Filed: Apr. 6, 1990

[51] Int. Cl.⁵ .............................................. G11C 7/00
[52] U.S. Cl. .................................. 365/154; 365/190; 365/230.03
[58] Field of Search ............... 365/154, 156, 181, 190, 365/207, 208, 230.03

[56] References Cited

U.S. PATENT DOCUMENTS

| | | | |
|---|---|---|---|
| 4,648,074 | 3/1987 | Pollachek | 365/184 |
| 4,665,507 | 5/1987 | Gondou et al. | 365/190 |
| 4,935,898 | 6/1990 | Miyaoka et al. | 365/190 |

OTHER PUBLICATIONS

Fumio Miyaji et al., "A 25ns 4Mb CMOS SRAM with Dynamic Bit Line Loads", *IEEE International Solid-State Circuits Conference*, Session 16. Feb. 17, 1989, pp. 250–251.
Hiroaki Okuyama et al., "A 7.5ns 32K×8 CMOS SRAM", *IEEE Journal of Solid-State Circuits*, vol. 23, No. 5, Oct. 1988, pp. 1054–1056.
Hiroshi Shimada et al., "A 18-ns 1-Mbit CMOS SRAM", *IEEE Journal of Solid-State Circuits*, vol. 23, No. 5, Oct. 1988, p. 1073.
Yoshio Kohno et al., "A 14-ns-Mbit CMOS SRAM with Varible Bit Organization", *IEEE Journal of Solid-State Circuits*, vol. 23, No. 5, Oct. 1988, pp. 1060–1061.
Katsuro Sasaki et al., "A 15-ns 1-Mbit CMOS SRAM", *IEEE Journal of Solid-State Circuits*, vol. 23, No. 5, Oct. 1988, p. 1067.
Wong et al., "A 11-ns 8K×18 CMOS State RAM with 0.5-μm Devices", *IEEE Journal of Solid-State Circuits*, vol. 23, No. 5, Oct. 1988, p. 1101.

Primary Examiner—Joseph A. Popek

[57] ABSTRACT

An SRAM uses PMOS column pass gates in conjunction with PMOS column loads which can be selectively deactivated during write operations. Address decoding for the pass gates and loads can be done outside of the memory array to maximize device density. This arrangement provides densities comparable to those achievable with NMOS column pass gates, but without the read access time penalties associated therewith.

6 Claims, 2 Drawing Sheets

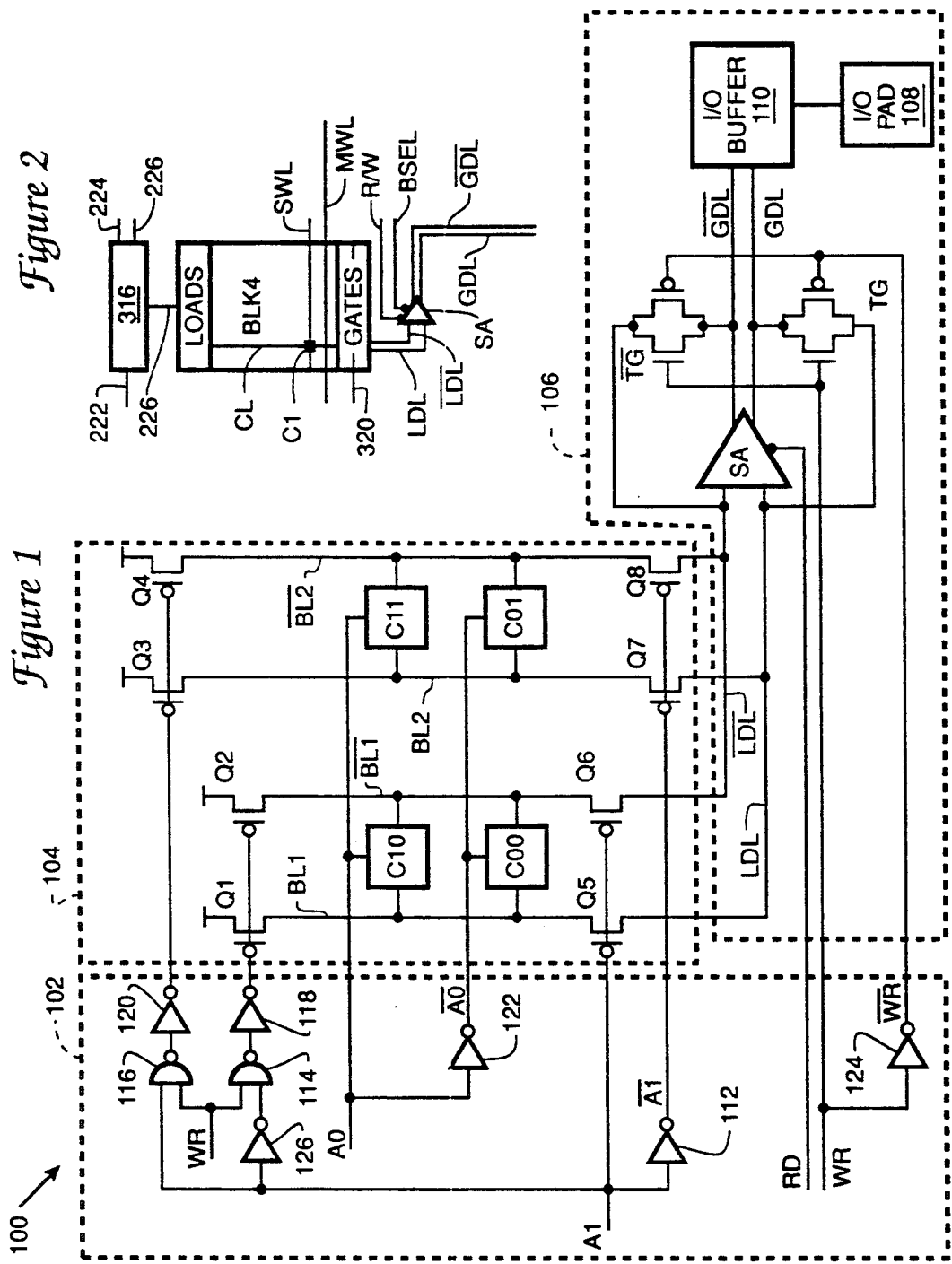

STATIC RANDOM ACCESS MEMORY WITH PMOS PASS GATES

BACKGROUND OF THE INVENTION

The present invention relates to electronics and, more particularly, to integrated circuit memory devices. A major objective of the present invention is to provide for faster and higher density SRAM devices.

Recent technological progress has been closely identified with the development of high-speed, high-density integrated circuits. Among the most prevalent of integrated circuit devices are random access memories (RAMs). RAMs are typically divided into dynamic random access memories (DRAMs) and static random access memories (SRAMs). DRAMs have the advantages of relatively low cost and relatively high density, but require refresh cycles which incur speed and power penalties.

SRAMs are favored where memory access times must be kept to a minimum. An increasingly common computer architecture uses high-density DRAM memory for bulk memory and SRAM as cache memory to speed access to the most commonly used operations and data. SRAMs also have relatively low power requirements and are commonly used in battery powered units, including portable computers.

A conventional SRAM architecture includes an array of memory cells arranged in rows and columns. Data is communicated to and from the memory device via data ports. Cells are selected as a function of address codes received at address inputs. Read and write operations are selected at control inputs. In addition, power and ground, for example, nominal 5 V and 0 V, respectively, are supplied at respective terminals. An address decoder decodes received addresses into control signals that implement the desired cell selection. The address decoder transmits signals along word lines which coupled cells in a row to respective true and false bit lines of a selected column. Some recent devices use divided word line architectures which separate the cell array into blocks to reduce capacitive loading on the (sub)-word lines. The address decoder also transmits signals to column pass gates or column transmission gates to couple selected bit lines to respective sense amplifiers and thence to the data ports.

SRAM devices generally include transistors fabricated using MOS technology. ("MOS" orginally described transistor gates which were fabricated using metal over a thin oxide layer; today, the term is applied more broadly to include transistors with gates of polysilicon over oxide). NMOS, PMOS and CMOS are three types of MOS technology. "NMOS" refers to n-type MOS transistors; "n-type" refers to a dopant introduced into silicon to enhance its ability to conduct electrons, which are negatively charged particles. "PMOS" uses p-type dopant which enhances the conduction of electron "holes", which are positive charges. "CMOS" means "complementary" MOS and involves the fabrication of both PMOS and NMOS devices on a single substrate. Usually, PMOS devices are fabricated in n-type wells while NMOS devices are formed within the primarily p-type substrate. NMOS has long prevailed over PMOS as a technology of choice, while CMOS has advanced rapidly as the advantages of combining PMOS and NMOS have often outweighed the complexity of combining them.

A MOS transistor includes a gate, a source and a drain. The gate typically acts as the control input to break or complete the electrical path between the source and the drain. In the case of the more common NMOS transistor, a voltage high at the gate closes, i.e., activates the transistor, provided the gate voltage exceeds the source voltage by at least a threshold voltage $V_t$, typically about 1 V; a voltage low at the gate opens, i.e., deactivates the transistor. In the case of the PMOS transistor, a voltage low at the gate closes the transistor, provided the source voltage exceeds the gate voltage by at least a threshold voltage $V_t$.

One typical SRAM memory cell design employs complementary, i.e., "true" and "false", pairs of NMOS transistors. Each pair includes a "state" transistor and an "access" transistor. Each state transistor has its source tied to ground; its source and gate are coupled respectively to the gate and source of the other pair. This arrangement tends to force the state transistors into complementary states. For example, a logic high at the source of the true state transistor implies a logic high at the gate of the false state transistor, which is thus closed. The source of the false state transistor is thus coupled to the drain of the false state transistor, and thus to ground. Therefore, the gate of the true transistor is held low so that the true transistor remains open and its source remains decoupled from ground. Its source thus can be pulled high through the respective access transistor.

Each access transistor has its drain coupled to the source of the respective state transistor and thus to the gate of the complementary state transistor. The source of each access transistor is tied to a respective bit line which is shared by all cells in a column. Thus, each column of memory cells has a true bit line and a false bit line. The gates of the access transistors are coupled to each other and to a word (or subword) line. A voltage high on the word line closes the access transistors electrically coupling the bit lines and the respective state transistors.

During a read operation, the bit lines coupled to a selected cell are coupled to a sense amplifier, which must sense the relative voltages on the bit lines to determine the contents of the selected cell. Sense amplifiers, along with their associated circuitry, are relatively large devices so high density architectures multiplex several columns to a sense amplifier. A column is selected for "sensing" when the pass gate or transmission gate for each of its two bit lines are activated. The other columns sharing the sense amplifier are decoupled as their gates remain open. Thus, an address decoder can select a desired memory cell by activating the corresponding word and column lines (and block select lines in divided word architectures).

During each read operation, at least one bit line is high, and thus so is the associated data line between the respective pass gate and the associated sense amplifier. During the next read operation, this formerly high data line must fall to a suitably intermediate level so as to meet the threshold requirement to turn on the pass gate for the next read operation. Ideally, the data line would return to about 4 V between reads. However, capacitive loading of the data line limits the rate at which this level to be approached. However, with the control gate at 5 V, an NMOS pass gate begins to turn on at 4 V, so that the bit line can be read well before the ideal intermediate level is reached.

The finer feature dimensions that make possible higher density SRAMs are more vulnerable to perturbations and therefore voltage levels are more subject to fluctuations. When a power source slews to 4 V, a formerly high data line must drop below 3 V for a selected NMOS pass gate to turn on for a subsequent read operation. If reading is performed too soon, an error is likely to result. If timing is slowed to ensure proper data line recovery when power is 4 V, access times are slow.

This problem with NMOS column pass gates can be addressed by using, in their stead, transmission gates. A transmission gate includes a PMOS transistor in parallel with an NMOS transistor. When ground is applied to its control gate, the PMOS transistor closes at voltages more than 1 V above ground. Thus, the PMOS transistor provides the desired coupling in the cases that give the NMOS transistor trouble, and vice versa.

Offsetting the clear advantage of transmission gates, are their costs in device area, as well as in routing and processing complexity. Obviously, a transmission gate requires two transistors to perform the function performed by one transistor in a pass gate. The CMOS technology required to fabricated NMOS and PMOS circuits together is more complex than NMOS technology. Normally, p-type wells must be defined within an NMOS substrate. These wells must be sufficiently large to avoid parasitic losses between device types. Thus, the wells add to the required spacing between neighboring NMOS and PMOS transistors. The relatively large column transmission gates can limit the pitch of the columns they are associated with and thus the density of the memory cells.

Inverters are required to generate complementary control signals for the PMOS and NMOS transistors. This means that logic elements, namely inverters, must be fabricated along with each column transmission gate. A typical inverter comprises a PMOS transistor and an NMOS transistor with their drains coupled. A transmission gate plus inverter can require a pitch ten times that otherwise required by cell columns. Alteratively, the inverters can be outside the memory array, but then the number of control lines bussed through the array is doubled. Routing complexity then increases geometrically.

Thus, transmission gates address the speed limitations of SRAMs using NMOS pass gates at the expense of device density and related factors. What is needed is an SRAM architecture which provides for the densities comparable to those provided by NMOS column pass gates and which provides access speeds comparable to those provided using column transmission gates.

SUMMARY OF THE INVENTION

In accordance with the present invention, an SRAM devices uses PMOS column pass gates in conjunction with column loads which can be turned off during write operations. Preferably, the column loads include PMOS transistors. All column decoding can be performed outside the memory array so that column pitch can be minimized.

After some initial popularity, PMOS technology has been all but supplanted by NMOS technology. PMOS devices have found a place in CMOS technology, although only in isolated wells within what are basically NMOS substrates. Part of the reason for this is that the normally-off NMOS transistors are preferred over normally-on PMOS transistors for reasons of power consumption and device protection.

PMOS pass gates have an advantage over NMOS pass gates during read operations. From the foregoing discussion of transmission gates, it is clear that PMOS pass gates are well suited reading formerly high data lines. They are more subject to problems reading formerly low data lines. However, these problems are manageable since ground level voltages vary less than power level voltages.

Write operations pose a more serious problem for PMOS column pass gates. In each write operation, at least one bit line must be forced low. When the data line is below 1 V, the respective pass gate does not close, and writing cannot occur. Just above 1 V, the pass gate opens only partially and the coupling can be insufficient to ensure the low write. Higher bit line voltages can ensure a closed pass gate, but at the cost of more ambiguous bit line voltages. The ambiguity is compounded by a voltage drop across column load transistors which can limit the high voltage level on a bit line to 4 V.

In accordance with the present invention, the column loads are turned off during write operations. This allows a partially closed PMOS pass gate to dominate the bit line and effectively set the desired voltages in an addressed memory cell. In addition, PMOS column loads can be used so that higher voltages represent logic highs on the bit lines so that high and low bit line levels are more readily distinguished.

Thus, the present invention provides for the use of simpler pass gates instead of transmission gates. The space and column pitch penalties of transmission gates are substantially avoided. Some space penalty relative to NMOS devices may be incurred due to the additional n-wells required. However, routing complexity is more comparable to NMOS pass gate approach than to the transmission gate approach. Improved read access times and reliability are provided relative to the NMOS pass gate approach. Potential problems during write cycles are avoided by selectively deactivating column loads. These and other features and advantages of the present invention are apparent from the description below with reference to the following drawings.

BRIEF DESCRIPTION OF THE DRAWINGS

FIG. 1 is a circuit diagram of a SRAM memory device in accordance with the present invention.

FIG. 2 is a schematic diagram of a part of an alternative SRAM device in accordance with the present invention.

DESCRIPTION OF THE PREFERRED EMBODIMENTS

Figure 3:
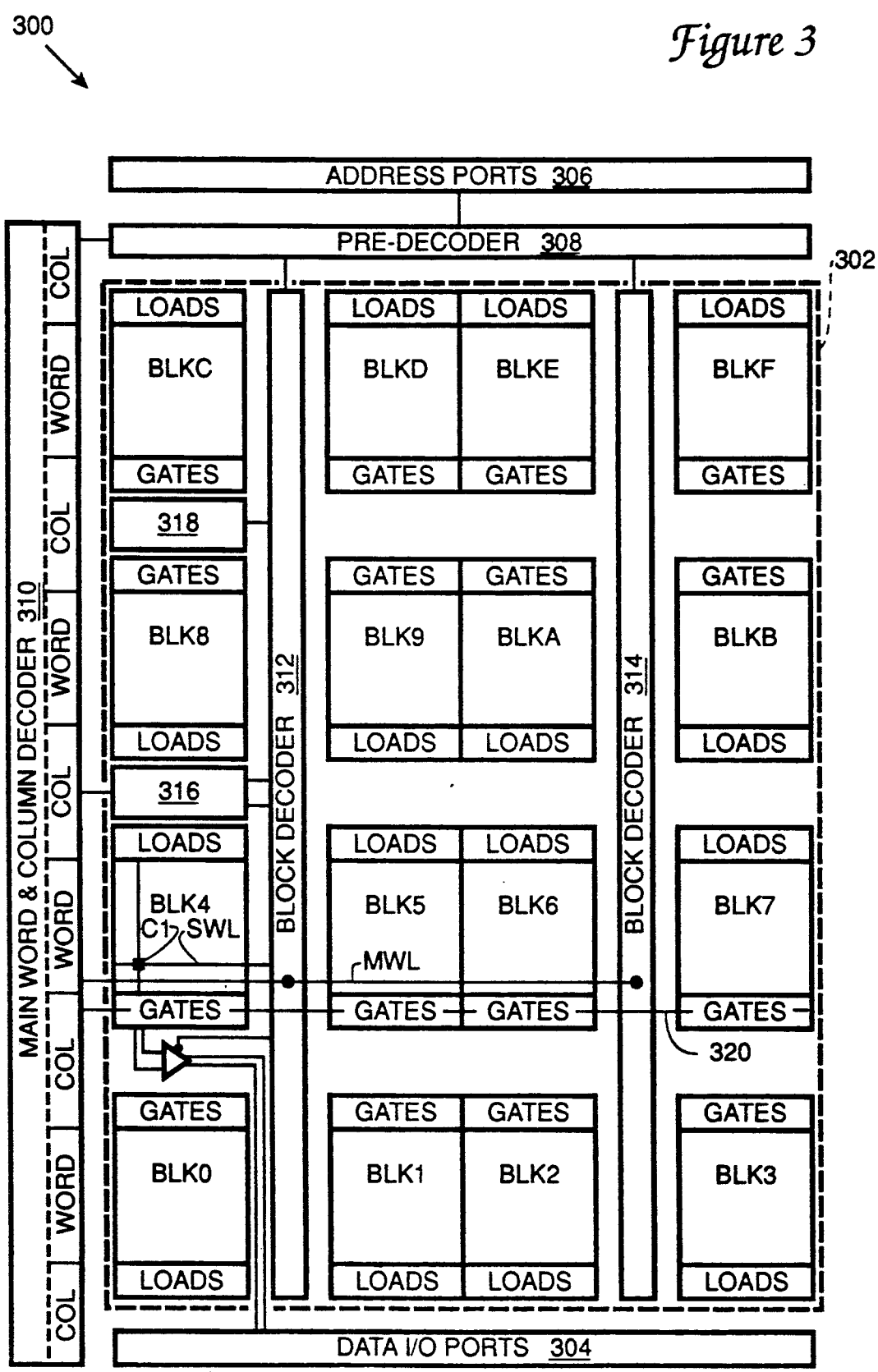
FIG. 3 is a schematic diagram of the SRAM device incorporating the part of FIG. 2.

In accordance with the present invention, a SRAM device 100 comprises an address section 102, a rectangular memory array section 104, and a data port section 106. Address section 102 includes address and read and write control inputs, as well as decoding logic for addressing memory array section 104. The latter comprises memory cells C00, C01, C10 and C11, as well as associated PMOS column loads Q1-Q4 and PMOS column pass gates Q5-Q8. Data port section 106 inlcudes an input/output (I/O) pad 108, and I/O buffer 110, a sense amplifier SA and transmission gates TG and TG.

First column cells C00 and C10 are coupled to a first true bit line BL1 and a first false bit line BL1. Second column cells C01 and C11 are coupled to a second true bit line BL2 and a second false bit line BL2. True bit lines BL1 and BL2 are alternatively couplable to a true local data line LDL through respective column pass gates Q5 and Q7. False bit lines BL1 and BL2 are alternatively couplable to a false local data line LDL through respective pass gates Q6 and Q8. Local data lines LDL and LDL are respectively couplable to global data lines GDL and GDL so that data can be transferred between the memory cells and data I/O pad 108. During read operations, sense amplifier SA is activated to couple the local data lines to the global data lines; during write operations, transmission gates TG and TG respectively couple the global data lines to the local data lines.

Since column pass gates Q5–Q8 are used rather than column transmission gates, relatively little area is consumed and the columnar pitch of array section 104 is minimally impacted. Rather than requiring local inverters, all column decoding can be done remotely in address section 102.

Since pass gates Q5–Q8 are PMOS transistors rather than NMOS transistors, the problem of access times after reads is minimized. The use of PMOS column loads Q1–Q4 provides a greater voltage range for the bit lines. Selectively turning off the column loads during write operations improves writing times and reliability.

The operation of SRAM 100 is explained below by way of illustrative read and write operations. In the read operation, a value, which is given as a logic 1, is read from cell C10. The host system supplies the following address and control code values, A0=1, A1=0, WR=0 and RD=1. A0 serves as the row select. Cells C10 and C11 of the upper row are selected. An inverter 122 generates A0, which is low in this example, so that the affected cells C00 and C01 of the lower row are not selected. Thus BL1 assumes the value stored in C10 and BL2 assumes the value stored in C11. Bit lines BL1 and BL2 assume respective complementary values. Since C10 stores a 1, BL1 is high and BL1 is low.

The low A1 level activates first column pass gates Q5 and Q6 coupling bit line BL1 to local data line LDL and bit line BL1 to local data line LDL. An inverter 112 generates A1 which is applied to second column pass gates Q7 and Q8; since A1 is low, A1 is high, and PMOS gates Q7 and Q8 remain off. WR is low, so the outputs of NAND gates 114 and 116 are high and the outputs of inverters 118 and 120 are low. Thus all column loads Q1–Q4 remain closed. An inverter 124 generates WR which is applied along with WR to transmission gates TG and TG, which remain off when WR=0. Note that while SRAM 100 uses transmission gates, it uses only two per sense amplifier, rather than two per column.

Since read signal RD=1. sense amplifier SA is enabled; this couples true local data line LDL to true global data line GDL and false local data line LDL to false global data line GDL. More precisely, sense amplifier SA senses the voltage differential between local data lines LDL and LDL. If LDL is greater, sense amplifier SA applies a logic high to global data line GDL and a logic low to global data line GDL. If LDL is greater, sense amplifier SA applies a logic low to global data line GDL and a logic high to GDL. I/O buffer 110 reads GDL and GDL differentially, forcing I/O pad 108 to high when GDL is greater and to low when GDL is greater. In the present case, BL1 is high, so LDL, GDL and I/O pad 108 are high. The host system can thus read the high value stored in cell C10 from I/O pad 108.

In an illustrative write operation, a logic high is to be written to cell C11. In this case, the host system provides the high data value to I/O pad 108. I/O buffer 110 buffers this value onto global data line GDL and provides its complement on GDL. Thus, GDL is high and GDL is low. The host system supplies A0=1, A1=1, WR=1, and RD=0. The read signal RD is low, so sense amplifier SA is disabled. WR is high and WR low so transmission gates TG and TG are on. Thus, GDL is coupled to LDL, which receives a logic high, and GDL is coupled to LDL, which receives a logic low. Since A1 is high, first column pass gates Q5 and Q6 are off and second column pass gates Q7 and Q8 are on. Accordingly, local data line LDL drives bit line BL2 high and local data line LDL drives bit line BL2 low.

The write signal WR is ANDed with A1 by NAND gate 116 and 120, yielding a logic high input for second column loads Q3 and Q4, which are thus shut off. Shutting off these column loads permits local data lines LDL and LDL to dominate selected bit lines BL2 and BL2. Thus, OV on LDL can maintain a near 1 V minimum on bit line BL2 as required a reliable write operation.

Due to the action of inverter 126, the control inputs to first column loads Q1 and Q2 remain low and Q1 and Q2 remain on. Thus, column load shut off is limited to the columns with activated pass gates. This selectivity minimizes current transients at write operation transitions. To this end, column decoding logic duplicated for column load selection. In SRAM 100, inverter 126 is an address replica of inverter 112.

The application of the present invention in the context of a divided word architecture is illustrated with reference to FIGS. 2 and 3. An SRAM 300 comprises a rectangular memory array section 302, data I/O ports 304, address ports 306, a predecoder 308, and a main decoder 310. Array section 302 includes 16 memory blocks BLK0–BLKF arranged in a 4×4 block array. To implement the divided word architecture, block decoders 312 and 314 extend most of the length of array section 302.

Each block includes an array of memory cells. In addition, each block includes column loads LOADS and column pass gates GATES. In the spaces, e.g., area 316, outside the blocks and above or below column loads includes decoding logic dedicated to selectively shutting off column loads. Spaces, such as 318, include sense amplifiers. In addition, spaces between blocks generally provide routing paths for local and global data lines, and decoded control lines.

There are 16 data I/O ports, so that SRAM 300 is arranged with 16-bit words. Each block array includes 256×256 cells, so SRAM 300 provides 1 megabit or 16K 16-bit words. Sixteen address ports of section 306 provide the required addressing. These break down into two row block addresses, six additional word line addresses, two column block addresses, and six column decoders. The two row block and two column block addresses are combined to provide block select signals. The six word line addresses and six column addresses are predecoded three at a time to save power as is known in the art.

Predecoded address lines, plus lines representing the row block addresses are coupled to main word and column decoder 310. Decoder 310 is shown segmented into word and column segments. The word decoder segments perform conventional main word line decoding. The column segments perform the column address decoding for the column pass gates and column loads.

The four block address codes are directed from the address ports to predecoder 308 and along block decoders 312 and 314. In addition, lines conveying read and write signal levels are conveyed along block decoders 312 and 314.

To select a cell C1, the 2+6 row address, as precoded, are used to select a main word line MWL. Main word line MWL is coupled to both block decoders 312 and 314. Block decoder 312 combines main word line MWL with block select lines to activate subword line SWL which activates a cell row of BLK4. A column segment of main decoder 310 decodes predecoded column addresses to activate a column address line 320, which, in turn, activates PMOS column pass gates in blocks BLK4-BLK7. This selects 16 cell columns of each block BLK4-BLK7 for connection to respective sets of 16 sense amplifiers (along with associated transmission gates). The sense amplifiers are coupled to data I/O ports 304. As indicated below, the sense amplifiers and associated transmission gates for blocks BLK5-BLK7 are disabled by signals from block decoders 312 and 314, so that only cells from BLK4 are selected for coupling to data ports 304.

In a read operation, block decoder 312 activates the 16 sense amplifiers associated with block BLK4. In a write operation, block decoder 312 activates the transmission gates associated the block BLK4 sense amplifiers, which remain deactivated. Also in a write operation, write signals and block select signals are provided by block decoder 312. These are combined at 316 with the column select signal from main decoder 310 to selectively deactivate column loads. The decoded column load controls signals are then conveyed from section 316 to the column loads of block BLK4. There are two transmission gates associated with each sense amplifier and thus 32 transmission gates per column. This amounts to only two transmission gates per 16 columns, which does not significantly limit column pitch.

Block BLK4 is shown in isolation in FIG. 2. Main word line MWL from main decoder 310 to block decoders 312 and 314 is shown crossing over BLK4. Subword line SWL from block decoder 312 is shown extending into BLK4, where it is coupled for activating all cells in a respective row. Line 320 from main decoder 310 extends into BLK4 where it activates thirty-two PMOS pass gates connected to sixteen true bit lines and sixteen false bit lines. One of sixteen columns CL so selected is indicated in FIG. 2. These bit lines are thus coupled to sixteen true local data lines and sixteen false local data lines; one true local data line LDL and one false local data line LDL are represented in FIG. 2. The bit lines and local data lines are replicated in each of the sixteen blocks.

Block decoder 312 provides read/write codes R/W to sixteen sense amplifiers SA per block. The sense amplifier SA shown in FIG. 2 represents a combination of sense amplifier and transmission gates for selectively bypassing the sense amplifier. A block read signal enables the sense amplifier, while a block write signal enables the transmission gates. In either case, the local data lines are coupled to thirty-two global data lines, sixteen true global data lines GDL and sixteen false global data line GDL. These thirty-two global data lines are shared by all sixteen blocks BLK0-F.

Column load decoder 316 receives column select signals along line 222 from main decoder 310. Column load decoder 316 also receives write signals along line 224 and block select signals along line 226 from block decoder 312. These are combined to deactivate selected PMOS column loads during write operations. The deactivation signals are communicated to the column loads via bus 226. The decoding details for SRAM 300 can be extrapolated from those described for SRAM 100.

The present invention provides a considerable simplification in column decoding. Pass gate lines, such as 320, extend across entire block rows and so can activate pass gates in all blocks within a row. This arrangement eliminates the need for column decoders dedicated to individual blocks. Column decoding can be performed remotely in main word and column decoder 310. This elimination results in a considerable saving in column pitch, array area and routing complexity. Since pass gates in multiple blocks are selected, column decoders 312 and 314 selectively enable only sense amplifiers SA of the selected block using a block select signal BSEL during read operations; during write operations the associated transmission gates of the selected block are similarly selectively enabled. The use of the BSEL signal to selectively enable sense amplifiers has the further advantage of minimizing capacitive loading on the global data lines, GDL and GDL.

Those skilled in the art can recognize that the present invention provides for a wide variety of alternative embodiments. Memory arrays of any size and shape are provided for. Irrespective of the actual shape of a memory array, there is a rectangle that encloses it. Remote column decoding can be implemented where the column decode logic is outside of the rectangular.

Memory devices of different sizes and word widths are provided for. Different addressing schemes can be used. Different arrangements of data ports, address ports, control ports and power and ground can be used. Decoding can be performed within the array region or outside or both. Column loads can include PMOS transistors, NMOS transistors or both. Different SRAM cell types, including four and six transistor cells can be used. These and other modifications to and variations upon the preferred embodiments are provided for by the present invention, the scope of which is limited only by the following claims.

I claim:

1. A static random access memory device comprising:
   plural memory cells including a first memory cell;
   data port means for coupling said memory cells to a host system so as to permit reading operations and writing operations therebetween, said data port means including at least a first data port;
   plural bit lines means for conveying data to and from said memory cells, said plural bit line means including a first true bit line and a first false bit line for conveying data to and from said first memory cell to said data port means;
   bit line means for supplying current to said plural bit lines, said load means including first load means for supplying current to said first true and false bit lines;
   PMOS pass gate means for selectively coupling said plural bit line means to said data port means, said PMOS pass gate means including a first true PMOS pass gate that when activated couples said first true bit line to said first data port, and a first false PMOS pass gate that when activated couples said first false bit line to said first data port, said PMOS pass gate when said first memory cell is selected in a write operation, directing data from said first data port means, through said first true and false PMOS pass gates, and through said first true and false bit lines for storage in said first memory cell, and when said first memory cell is selected in a read operation, directing data from said first memory cell, through said first true and false bit lines, through said first true and false PMOS pass gates, and to said first data port means; and address means for selecting among said memory cells for coupling to said host system and for alternatively selecting between reading and writing operations for the memory cells so addressed, said address means being coupled to said plural bit line load means and said PMOS pass gate means so as to when said first memory cell is selected, activate said first true PMOS pass gate and said first false PMOS pass gate, and when said first memory cell is selected and a write operation is selected, deactivate said first load means so that said first load means supplies at most negligible current to said first true and false bit lines.

2. A static random access memory device as recited in claim 1 wherein said bit line load means includes PMOS transistors.

3. A static random access memory device comprising:

an array of memory cells, said array defining a rectangular area containing said memory cells, said array having its memory cells arranged in rows and columns;

data port means for coupling said memory cells to a host system so as to permit reading operations and writing operations therebetween;

plural bit lines for conveying data to and from said memory cells, said plural bit line means including a respective true bit line and a respective false bit line for each of said columns for conveying data to and from a selected memory cell in that column;

plural bit line load means for supplying current to said plural bit lines, said plural bit line load means including a respective true and a false bit line load for each of said columns;

PMOS pass gate means for selectively coupling said columns to said data port means, for each of said columns, said PMOS pass gate means including a respective true PMOS pass gate which, when activated, couples the respective true bit line to said data port means, and a respective false PMOS pass gate which, when activated, couples the respective false bit line to said data port means, said PMOS pass gate means when one of said memory cells is selected in a write operation, directing data from said first data port means, through respective true and false PMOS pass gates, and through respective true and false bit lines for storage in said memory cell, and when said memory cell is selected in a read operation, directing data from said memory cell, through respective true and false bit lines, through said first true and false PMOS pass gates, and to said data port means;

word line means for selectively coupling a row of memory cells to their respective true and false bit lines; and address means for selecting among said memory cells for coupling to said host system and for alternatively selecting between reading and writing operations for the memory cells so addressed, said address means being coupled to said word line means for coupling a selected memory cell in a column to the respective true and false bit lines for that column, to said PMOS pass gate means for activating the respective true and false PMOS pass gates for that column, and to said bit line load means so that, when a write operation is selected, said address means can deactivate the respective true and false bit line loads for that column, but not for another of said columns, so that they supply at most negligible current to said respective true and false bit lines.

4. A memory device as recited in claim 3 wherein each of said PMOS pass gates has a respective control gate, the voltage at which determines the activation status of the including PMOS pass gate, and wherein said address means includes gate decoding logic for decoding received address codes into voltage levels applied to said control gates, all of said gate decoding logic being located outside said rectangular area.

5. A static random access memory device as recited in claim 4 wherein said memory array is divided into multiple blocks, each of said blocks including an associated subarray of said memory cells, associated cell rows of said cells, and associated cell columns of said cells, each of said blocks having an associated set of sense amplifiers coupled to said data port means, each of said cell columns having a respective pair of pass gates for coupling its cells to said data port means, said gate decoding logic including multiple gate control lines, each of said gate control lines being coupled to gates in at least two of said blocks, including a first block and a second block, said address means including block select means for selectively coupling said blocks to said data port so that when said gate decoding logic couples cells in said first block to its associated sense amplifiers and couples cells in said second block to its respective sense amplifiers, said block select means can enable the sense amplifiers associated with said first block and disable the sense amplifiers associated with said second block so that cells of said first block are coupled to said data port means and cells of said second block are decoupled from said data port means.

6. A static random access memory device as recited in claim 4 wherein said bit line load means includes PMOS transistors.

* * * * *